US008541736B2

(12) United States Patent
Baba et al.

(10) Patent No.: US 8,541,736 B2
(45) Date of Patent: Sep. 24, 2013

(54) PHOTOELECTRIC CONVERSION MODULE HAVING DUAL CIRCUIT BOARD AND DUAL DUST PROOFING MEMBER

(75) Inventors: Akiyoshi Baba, Hitachi (JP); Yoshiaki Ishigami, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 269 days.

(21) Appl. No.: 13/067,587

(22) Filed: Jun. 10, 2011

(65) Prior Publication Data
US 2012/0018624 A1  Jan. 26, 2012

(30) Foreign Application Priority Data
Jul. 20, 2010  (JP) .................................. 2010-162870

(51) Int. Cl.
*H01J 5/02*  (2006.01)
(52) U.S. Cl.
USPC ......................................... 250/239; 250/551
(58) Field of Classification Search
USPC ........ 250/239, 551, 227.11, 216; 385/88–93; 361/736, 737, 752–760; 257/690; 438/109
See application file for complete search history.

(56) References Cited

U.S. PATENT DOCUMENTS

| 5,408,384 A | 4/1995 | Gannyo et al. |
| 7,090,410 B2 * | 8/2006 | Kambe et al. ................... 385/88 |
| 2010/0080518 A1 | 4/2010 | Teo et al. |

FOREIGN PATENT DOCUMENTS

JP          H 7-254054 A          10/1995

OTHER PUBLICATIONS

Notification of Reason(s) for Refusal dated Jun. 25, 2013, with English translation.

* cited by examiner

*Primary Examiner* — Que T Le
(74) *Attorney, Agent, or Firm* — McGinn IP Law Group, PLLC

(57) ABSTRACT

A photoelectric conversion module includes a housing including a first wall and a second wall parallel to each other, a first circuit board and a second circuit board arranged between the first wall and the second wall, a spacer disposed between the first circuit board and the second circuit board, a first dust proofing member for sealing a gap between the first wall and the first circuit board and a gap between the spacer and the first circuit board, and a second dust proofing member for sealing a gap between the second wall and the second circuit board and a gap between the spacer and the second circuit board. The first circuit board includes a first holding portion for holding the first dust proofing member. The second circuit board includes a second holding portion for holding the second dust proofing member.

7 Claims, 8 Drawing Sheets

FIG. 14  130 (132)
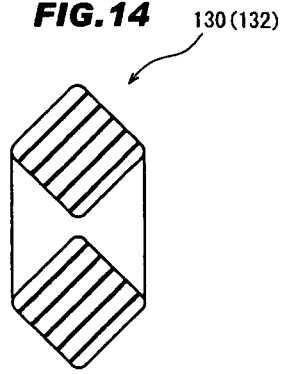
FIG. 15
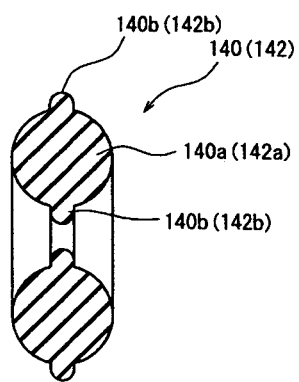
140b (142b)
140 (142)
140a (142a)
140b (142b)
FIG. 16  150 (152)
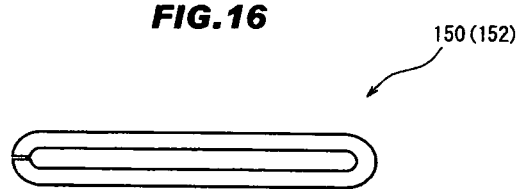

PHOTOELECTRIC CONVERSION MODULE HAVING DUAL CIRCUIT BOARD AND DUAL DUST PROOFING MEMBER

The present application is based on Japanese patent application No. 2010-162870 filed on Jul. 20, 2010, the entire contents of which are incorporated herein by reference.

BACKGROUND OF THE INVENTION

1. Field of the Invention

This invention relates to a photoelectric conversion module (herein the term "photoelectric conversion module" used to mean both an optical to electrical conversion module and an electrical to optical conversion module), and more particularly, to a photoelectric conversion module with two circuit boards.

2. Description of the Related Art

In a network system such as a data center or the like, optical fibers as well as metal wires are used as a transmission medium for connection between servers, or between a server and a relay device such as a switching hub or the like.

The use of the optical fibers requires photoelectric conversion modules to convert electrical signals to optical signals, or optical signals to electrical signals. The photoelectric conversion modules are attached to be fixed to the relay device, or to be insertable to or removable from the relay device. The photoelectric conversion modules, which are attached to be insertable to or removable from the relay device, are called SFP (small form-factor pluggable) modules. Also, the photoelectric conversion modules are attached to be fixed to ends of the optical fibers, or to be attachable to or detachable from ends of the optical fibers.

In the case of the SFP modules, a photoelectric conversion module housing has an opening at one end in the insertion or removal direction, and in the opening of the housing, an end of a circuit board is positioned. The end of the circuit board is insertable into a slot provided in the relay device. The circuit board is inserted into the slot, thereby electrically connecting its photoelectric conversion module to the relay device.

Also, the photoelectric conversion module has in the housing photoelectric conversion elements, i.e. light emitting elements and light receiving elements, and the photoelectric conversion elements are optically coupled to the ends of the optical fibers respectively, via a lens. The photoelectric conversion elements are connected to a driver circuit mounted on the circuit board, and the driver circuit is electrically connected to the relay device.

As this type of the photoelectric conversion module, US2010/0080518A1 discloses a photoelectric conversion module having two circuit boards arranged to be parallel to each other.

The distance between the circuit boards is defined in accordance with the MSA (Multi-Source Agreement) between photoelectric conversion module venders. Accordingly, the distance between the circuit boards is held at the defined value, by a spacer being arranged between the two circuit boards.

Refer to US2010/0080518A1, for example.

SUMMARY OF THE INVENTION

In the photoelectric conversion module disclosed by US2010/0080518A1 above, there are gaps between the spacer and the two circuit boards. When from the gaps, dust enters the housing, and adheres to the ends of the optical fibers, the lens, or the photoelectric conversion elements, the optical coupling efficiency therebetween may degrade.

This problem is serious, particularly when the lens or the photoelectric conversion elements are mounted on the two circuit boards, and positioned adjacent to the spacer, and the distances between the gaps and the lens or the photoelectric conversion elements are therefore short, and no shielding material is provided in the gaps.

Accordingly, it is an object of the present invention to provide a photoelectric conversion module, whose housing is protected from dust entrance, and whose optical system is thereby prevented from lowering in performance due to the dust.

(1) According to one embodiment of the invention, a photoelectric conversion module comprises:

a housing including a first wall and a second wall parallel to each other, and an open end defined by respective ends of the first wall and the second wall;

a photoelectric conversion element arranged in the housing;

an integrated circuit arranged in the housing, the integrated circuit to be electrically connected with the photoelectric conversion element;

a first circuit board arranged between the first wall and the second wall, the first circuit board being parallel thereto, and including adjacent to the open end an end that is connectable to an external device;

a second circuit board arranged between the first wall and the second wall, the second circuit board being parallel thereto, and including adjacent to the open end an end that is connectable to the external device;

electrode terminals provided at the ends of the first circuit board and the second circuit board respectively, the electrode terminals being electrically connected to the integrated circuit;

a spacer disposed between the first circuit board and the second circuit board, the spacer including two pillars for defining a distance between the first circuit board and the second circuit board, and a beam extending between the pillars;

a first dust proofing member for sealing a gap between the first wall and the first circuit board and a gap between the spacer and the first circuit board; and a second dust proofing member for sealing a gap between the second wall and the second circuit board and a gap between the spacer and the second circuit board, wherein the first circuit board further includes a first holding portion for holding the first dust proofing member, while the second circuit board further includes a second holding portion for holding the second dust proofing member.

According to the embodiment (1), the gap between the first wall and the first circuit board and the gap between the spacer and the first circuit board are sealed by the first dust proofing member, and the gap between the second wall and the second circuit board and the gap between the spacer and the second circuit board are sealed by the second dust proofing member. Thus, the duct can be prevented from entering into the housing. Therefore, the photoelectric conversion module can prevent the degradation in the optical system performance. Also, since the first dust proofing member and the second dust proofing member are held by the first holding portion of the first circuit board and the second holding portion of the second circuit board respectively, the assembly of the module can be facilitated.

In the above embodiment (1) of the invention, the following modifications and changes can be made.

(i) The first dust proofing member and the second dust proofing member are each formed of a ring shaped elastic material, and the first holding portion and the second holding portion comprise a pair of notches formed at both side edges of the first circuit board and a pair of notches formed at both side edges of the second circuit board, respectively.

According to the embodiment (i), the first dust proofing member and the second dust proofing member are each formed of the ring shaped elastic material, and are fitted into the first circuit board and the second circuit board, respectively, such that they are engaged into the pair of notches formed at both side edges of the first circuit board and the second circuit board, respectively. Thus, the first dust proofing member and the second dust proofing member can be surely held by that simple structure.

(ii) The spacer includes a first groove to receive a portion of the first dust proofing member, and a second groove to receive a portion of the second dust proofing member.

According to the embodiment (ii), the spacer includes the first groove and the second groove to receive a portion of the first dust proofing member and the second dust proofing member, respectively. Thus, at the assembled state of the module, the first dust proofing member and the second dust proofing member can be surely held by that simple structure. Also, since the first groove and the second groove receive a portion of the first dust proofing member and the second dust proofing member, respectively, the duct can be more surely prevented from entering into the housing.

(iii) The first wall includes a third groove to receive a portion of the first dust proofing member, and the second wall includes a fourth groove to receive a portion of the second dust proofing member.

According to the embodiment (iii), the first wall and the second wall include the third groove and the fourth groove to receive a portion of the first dust proofing member and the second dust proofing member, respectively. Thus, at the assembled state of the module, the first dust proofing member and the second dust proofing member can be more surely held by that simple structure. Also, since the third groove and the fourth groove receive a portion of the first dust proofing member and the second dust proofing member, respectively, the duct can be more surely prevented from entering into the housing.

(iv) The first dust proofing member and the second dust proofing member are each formed of a foaming material.

According to the embodiment (iv), the first dust proofing member and the second dust proofing member are each formed of the foaming material that includes the air in the pores. This allows the first and second dust proofing members to be low in dielectric constant, thereby suppressing the delay of high frequency signals propagating in the first and second dust proofing members. This results in the excellent high frequency signal transmission properties of the module while being protected from the dust entrance.

(v) The first dust proofing member and the second dust proofing member each include a body, and a deformable portion that is more compressed or deformed than the body.

According to the embodiment (v), the first and second dust proofing members can, by being compressed and deformed, securely fill the gaps between the first wall and the spacer and the first circuit board, and the gaps between the second wall and the spacer and the second circuit board. Consequently, the module can more securely prevent the dust from entering into the housing.

(vi) The first dust proofing member and the second dust proofing member are each formed of an ethylene propylene rubber being not vulcanized with sulfur or a silicon rubber containing a reduced low molecular siloxane component.

According to the embodiment (vi), the first dust proofing member and the second dust proofing member are each formed of the ethylene propylene rubber being not vulcanized with sulfur or the silicon rubber containing the reduced low molecular siloxane component. This allows the electrode terminals to be prevented from lowering in electrical conductivity due to the adhesion of the sulfur or the low molecular siloxane component desorbed from the first and second dust proofing members. This results in long-term stable operation of the module.

Points of the Invention

According to one embodiment of the invention, a photoelectric conversion module is constructed such that a first dust proofing member fills or seals a gap between a first wall of a housing and a spacer and a first circuit board sandwiched therebetween, and a second dust proofing member fills or seals a gap between a second wall of the housing and the spacer and a second circuit board sandwiched therebetween, so as to prevent a dust from entering into the housing. Thus, the module can prevent the degradation in an optical system performance, i.e. degradation in an optical coupling efficiency thereof, due to the dust.

BRIEF DESCRIPTION OF THE DRAWINGS

The preferred embodiments according to the invention will be explained below referring to the drawings, wherein:

FIG. 14 is a schematic cross sectional view showing a first dust proofing member (or a second dust proofing member) in a modification to the embodiment;

FIG. 15 is a schematic cross sectional view showing a first dust proofing member (or a second dust proofing member) in a modification to the embodiment; and FIG. 16 is a schematic plan view showing a first dust proofing member (or a second dust proofing member) in a modification to the embodiment.

DETAILED DESCRIPTION OF THE PREFERRED EMBODIMENTS

Below is described one embodiment according to the invention in reference to the accompanying drawings.

Figure 1:
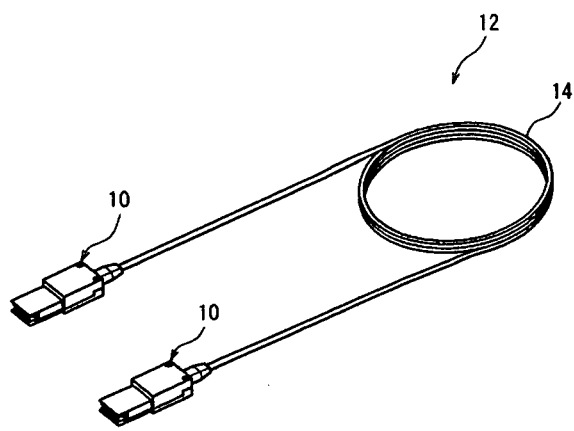
FIG. 1 is a schematic perspective view showing a configuration of an optical active cable having photoelectric conversion modules in one embodiment.

FIG. 1 is a schematic perspective view showing a configuration of an optical active cable 12 having photoelectric conversion modules 10 in one embodiment. The optical active cable 12 comprises one optical cable 14, and the two photoelectric conversion modules 10 attached to both ends, respectively, of the optical cable 14. The optical active cable 12 is for use in, for example 10 Gbit×12 channel parallel communications, and connection between servers, or between a server and a relay device such as a switching hub or the like.

Figure 2:
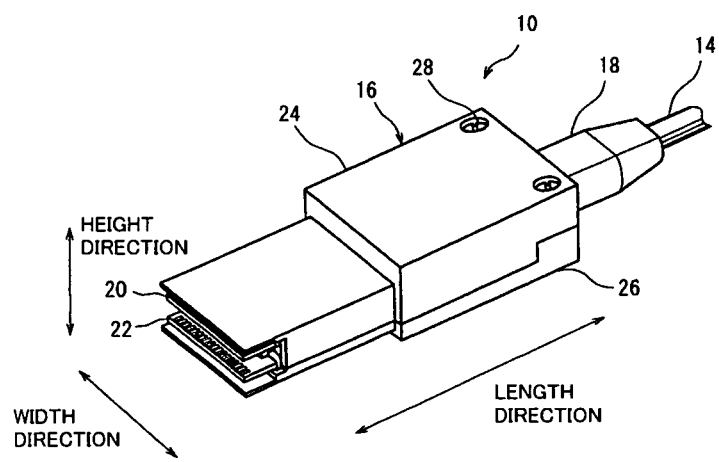
FIG. 2 is a perspective enlarged view showing one of the photoelectric conversion modules of the optical active cable of FIG. 1.

FIG. 2 is a perspective enlarged view showing the photoelectric conversion module 10, along with a portion of the optical cable 14.

The photoelectric conversion module 10 includes, for example a metallic housing 16, and the housing 16 is shaped into a step box. When viewed in a length direction of the housing 16, the optical cable 14 extends out of one end of the housing 16 via a sealing member 18. On the other hand, when viewed in the length direction of the housing 16, the other end of the housing 16 is formed with an opening.

Incidentally, in FIG. 2, for explanation, the length direction, width direction, and height direction of the housing 16 are indicated by use of arrows. The length direction of the housing 16 is the same as the direction of insertion or removal of the photoelectric conversion module 10 relative to the relay device or the like. The height direction and the width direction of the housing 16 are not necessarily vertical and horizontal respectively in space, when the photoelectric conversion module 10 is attached to the relay device.

In the opening of the housing 16, respective ends of two circuit boards, i.e. a first circuit board 20 and a second circuit board 22 are positioned. The ends of the first circuit board 20 and the second circuit board 22 are insertable into a slot provided in the relay device.

Housing 16

More specifically, the housing 16 comprises a first case 24 and a second case 26, which are separatable from each other in the height direction thereof, for example. The first case 24 and the second case 26 are fixed to each other by use of two screws 28, for example.

Figure 3:
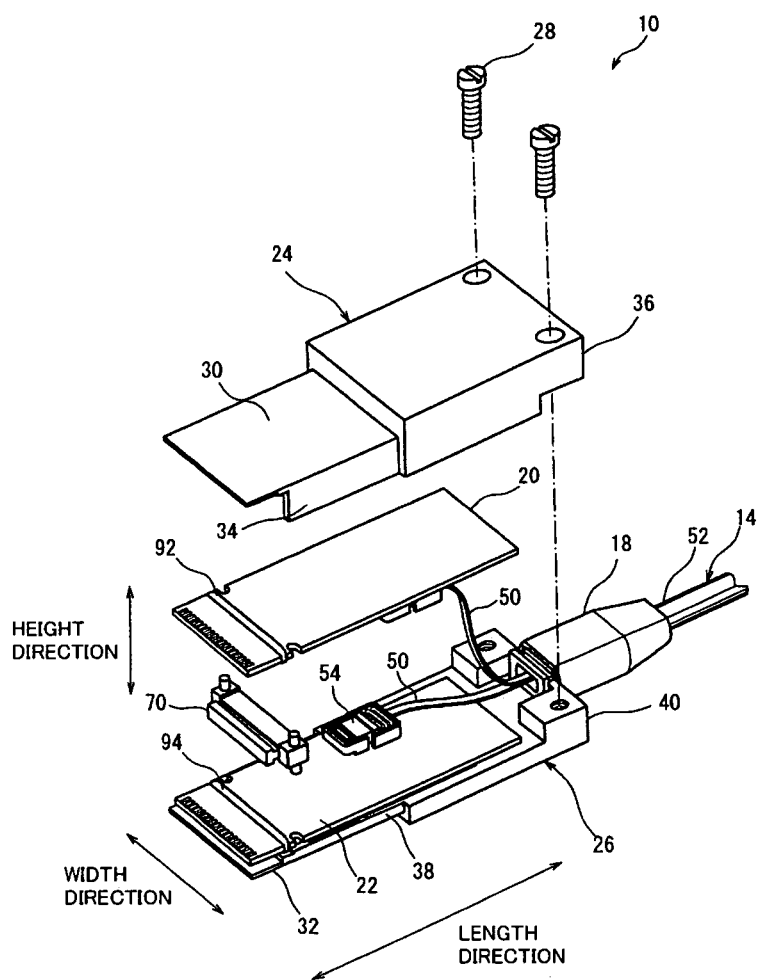
FIG. 3 is a schematic perspective exploded view showing the photoelectric conversion module of FIG. 2.
Figure 4:
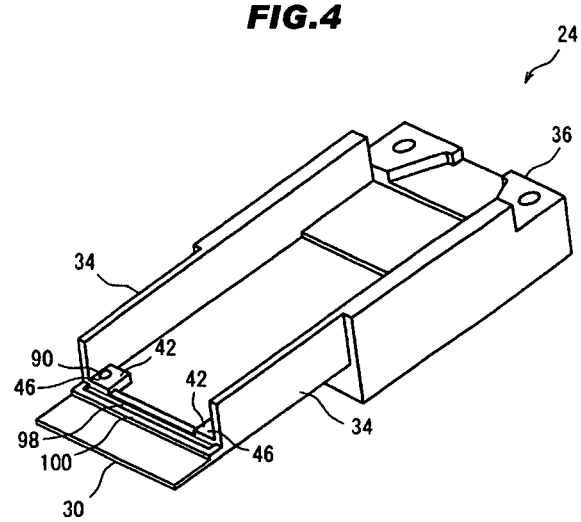
FIG. 4 is a schematic perspective enlarged view showing a first case in FIG. 2.
Figure 5:
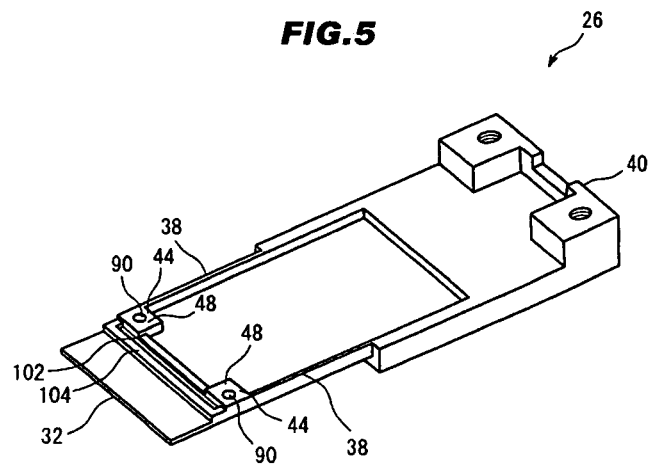
FIG. 5 is a schematic perspective enlarged view showing a second case in FIG. 2.

FIG. 3 is a schematic perspective exploded view showing the photoelectric conversion module 10, FIG. 4 is a schematic perspective view showing the first case 24, and FIG. 5 is a schematic perspective view showing the second case 26.

The first case 24 has a first wall 30, which is one of the first wall 30 and a second wall 32, which the housing 16 has, and which are spaced apart from each other in the height direction of the housing 16. The first case 24 then has side walls 34, which are integral with side edges, respectively, of the first wall 30, and an end wall 36, which is integral with an end edge of the first wall 30. On the other hand, the second case 26 has the second wall 32, side walls 38 which are integral with side edges, respectively, of the second wall 32, and an end wall 40, which is integral with an end edge of the second wall 32.

The first wall 30 and the second wall 32 are longer in the length direction than the side walls 34 and the side walls 38, and the opening side ends of the first wall 30 and the second wall 32 project in the length direction beyond the ends of the side walls 34 and the side walls 38. Also, the side walls 34 of the first case 24 are higher than the side walls 38 of the second case 26.

The side walls 34 of the first case 24 and the side walls 38 of the second case 26 are contacted with each other, to thereby constitute side walls of the housing 16. Likewise, the end wall 36 of the first case 24 and the end wall 40 of the second case 26 are contacted with each other, to thereby constitute an end wall of the housing 16.

Incidentally, the outer shape of the housing 16 is the step box shape, and the outer surfaces of the first wall 30, the second wall 32, the side walls 34 and the side walls 38 therefore has the step shapes, respectively.

Also, the first case 24 and the second case 26 are provided with two mounts 42 and two mounts 44 to support the first circuit board 20 and the second circuit board 22, respectively.

The mounts 42 and 44 are shaped into a flattened rectangular parallelepiped, and project in the height direction by a specified length from the first wall 30 and the second wall 32, respectively. In the first case 24, the two mounts 42 are spaced apart from each other in the width direction of the housing 16, and are integral with the side walls 34, respectively. Likewise, in the second case 26, the two mounts 44 are spaced apart from each other in the width direction of the housing 16, and are integral with the side walls 38, respectively.

The mounts 42 and 44 have contact surfaces 46 and 48 parallel to the first wall 30 and the second wall 32, respectively, and the first circuit board 20 and the second circuit board 22 are contacted with the contact surfaces 46 and 48, respectively.

On the other hand, the end wall 36 of the first case 24 and the end wall 40 of the second case 26 are provided with notches, respectively, and these notches meet at the end wall of the housing 16 to form one opening. This opening is mated with one end of the sealing member 18.

Optical Cable 14

The optical cable 14 comprises, for example, two optical fiber bundles 50, and a jacket 52 for covering the optical fiber bundles 50. Each optical fiber bundle 50 includes a plurality of optical fibers, and extends through the sealing member 18 into the housing 16. The tips of the optical fiber bundles 50, i.e. the tips of the plural optical fibers positioned inside the housing 16 are each then attached to an MT ferrule 54.

First Circuit Board 20 and Second Circuit Board 22

Figure 6:
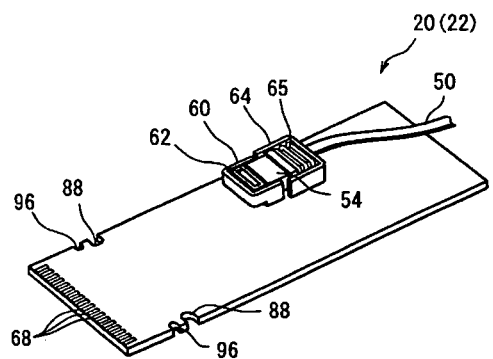
FIG. 6 is a schematic perspective enlarged view showing a first circuit board (or a second circuit board), together with a lens block, etc., in the photoelectric conversion module of FIG. 2.

FIG. 6 is a schematic perspective view showing the first circuit board 20, together with the optical fiber bundle 50 and the MT ferrule 54. Incidentally, because the first circuit board 20 and the second circuit board 22 are substantially identical in appearance, FIG. 6 is the schematic perspective view also showing the second circuit board 22, together with the optical fiber bundle 50 and the MT ferrule 54.

The first circuit board 20 and the second circuit board 22 are made of e.g. a glass epoxy, and are rectangular in outer shape. The length direction, width direction and thickness direction of the first circuit board 20 and the second circuit board 22 are the same as the length direction, width direction and height direction, respectively, of the housing 16. The widths of the first circuit board 20 and the second circuit board 22 are substantially equal to the distance between the side walls 34 of the first case 24 and the distance between the side walls 38 of the second case 26, and side edges of the first circuit board 20 and side edges of the second circuit board 22 are to be closely contacted with inner sides of the side walls 34, respectively, of the first case 24.

On the first circuit board 20 and the second circuit board 22, a lens holder 60 formed in a U shape in a plan view is fixed thereto, and a lens block 62 is held by that lens holder 60. The lens block 62 is connected with the MT ferrule 54 via a guide pin not shown.

In order to prevent the slipping of the MT ferrule 54, a ferrule holder 64 is fixed to the first circuit board 20 and the second circuit board 22. The ferrule holder 64 is formed in a U shape in the plan view, and disposed opposite the lens holder 60. A compressed coil spring 65 is disposed between the ferrule holder 64 and the MT ferrule 54, so that the MT ferrule 54 is in contact with the lens block 62, with the MT ferrule 54 being biased by that compressed coil spring 65.

Figure 7:
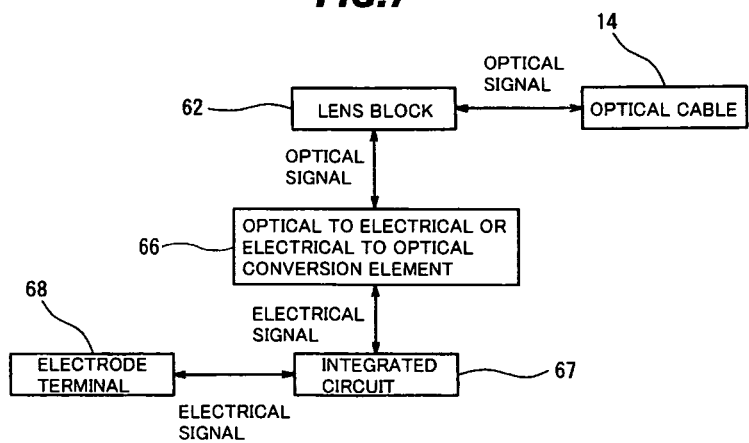
FIG. 7 is an explanatory block diagram showing a circuit configuration of the photoelectric conversion module of FIG. 2.

Referring to FIG. 7, a plurality of photoelectric conversion elements 66, such as light emitting elements or light receiving elements, are also disposed on the first circuit board 20 and the second circuit board 22, and the ends of the plural optical fibers in the optical cable 14 are to be optically coupled by the lens block 62, to the corresponding photoelectric conversion elements 66, respectively.

Further, an integrated circuit 67 to be electrically connected with the photoelectric conversion elements 66 is mounted on the first circuit board 20 and the second circuit board 22. The integrated circuit 67 and the photoelectric conversion elements 66 are electrically connected together by means of wire bonding, for example.

Specifically, when the photoelectric conversion elements 66 are the light emitting elements, the integrated circuit 67 is a driver circuit to drive the light emitting elements, or when the photoelectric conversion elements 66 are the light receiving elements, the integrated circuit 67 is an amplifier circuit to amplify electrical signals from the light receiving elements.

On the other hand, a plurality of electrode terminals 68 are aligned at the respective ends of the first circuit board 20 and the second circuit board 22, and a plurality of wiring patterns not shown, which extend from each electrode terminal 68 to the integrated circuit 67, are formed on the first circuit board 20 and the second circuit board 22. The respective ends of the wiring patterns and the integrated circuit 67 are also then electrically connected together by means of wire bonding, for example. Accordingly, the electrode terminals 68 are electrically connected with the integrated circuit 67.

Incidentally, in the housing 16, the photoelectric conversion elements 66 and the lens block 62 mounted on the first circuit board 20 are arranged on the second circuit board 22 side of the first circuit board 20, while the photoelectric conversion elements 66 and the lens block 62 mounted on the second circuit board 22 are arranged on the first circuit board 20 side of the second circuit board 22. The photoelectric conversion elements 66 and the lens block 62 of the first circuit board 20, and the photoelectric conversion elements 66 and the lens block 62 of the second circuit board 22 are then arranged on one side in the width direction of the first circuit board 20 and the second circuit board 22, respectively, so as not to cause interference between the respective lens blocks 62, the respective MT ferrules 54 or the like of the first circuit board 20 and the second circuit board 22.

In this manner, the optical system comprising the photoelectric conversion elements 66, the lens blocks 62, and the MT ferrules 54, is arranged in the space defined between the first circuit board 20 and the second circuit board 22.

Spacer 70

The first circuit board 20 and the second circuit board 22 are spaced apart from each other in the height direction of the housing 16. Here, to hold a specified parallel distance between the first circuit board 20 and the second circuit board 22, a spacer 70 is disposed therebetween.

Figure 8:
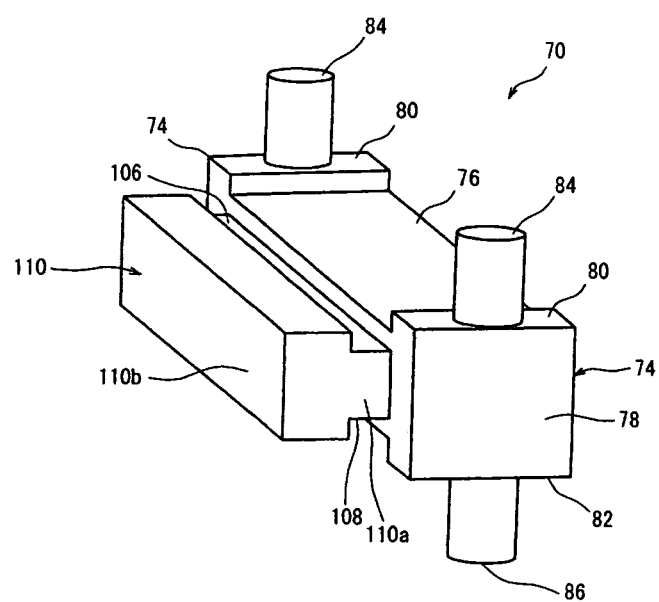
FIG. 8 is a schematic perspective enlarged view showing a spacer in the photoelectric conversion module of FIG. 2.

FIG. 8 is a schematic perspective enlarged view showing the spacer 70.

As shown in FIG. 8, the spacer 70 includes two pillars 74 interposed between the first circuit board 20 and the second circuit board 22, and a beam 76 for integral joining between the pillars 74. The pillars 74 are shaped into a square pillar, for example, and include side surfaces 78 which are to be closely contacted with the side walls 34, respectively, of the first case 24.

Also, the pillars 74 include first end faces 80, respectively, which are to be closely contacted with the first circuit board 20, and the second end faces 82, respectively, which are to be closely contacted with the second circuit board 22. The first end faces 80 and the second end faces 82 have columnar protrusions 84 and 86 protruding therefrom in the height directions, respectively, of the housing 16.

Here, referring to FIG. 6, the first circuit board 20 and the second circuit board 22 are being formed with two notches 88 and two notches 88 to receive the protrusions 84 and 86, respectively.

Referring to FIGS. 4 and 5, the two mounts 42 and the two mounts 44 of the first case 24 and the second case 26 are then formed with holes 90 having bottoms to receive the protrusions 84 and 86, respectively. The holes 90 open at the contact surfaces 46 and 48, respectively, and the protrusions 84 and 86 are passed through the notches 88 of the first circuit board 20 and the second circuit board 22, respectively, and inserted into the holes 90 of the mounts 42 and 44, respectively.

In this manner, the distance between the first circuit board 20 and the second circuit board 22 is defined by the pillars 74 of the spacer 70, while the position of the first circuit board 20 in the width direction and the length direction of the housing 16 and the position of the second circuit board 22 in the width direction and the length direction of the housing 16 are defined by the protrusions 84 and 86, respectively, of the spacer 70.

First Dust Proofing Member 92 and Second Dust Proofing Member 94

The beam 76 is shorter than the pillars 74 in length in the height direction of the housing 16. For this, gaps exist between the beam 76 and the first circuit board 20, and between the beam 76 and the second circuit board 22, respectively. Also, gaps exist between the first wall 30 and the first circuit board 20, and between the second wall 32 and the second circuit board 22, respectively. To fill these gaps, the photoelectric conversion module 10 further includes a first dust proofing member 92 and a second dust proofing member 94.

Figure 9:
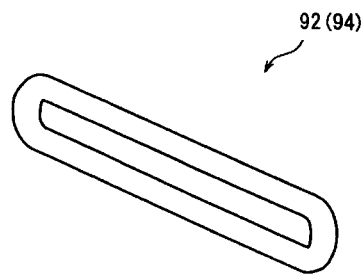
FIG. 9 is a schematic perspective enlarged view showing a first dust proofing member (or a second dust proofing member) in the photoelectric conversion module of FIG. 2.

FIG. 9 is a schematic perspective view showing the first dust proofing member 92. Incidentally, because the first dust proofing member 92 and the second dust proofing member 94 are identical in configuration, FIG. 9 is the schematic perspective view also showing the second dust proofing member 94.

The first dust proofing member 92 and the second dust proofing member 94 have an elongated ring shape in the width direction of the housing 16. The first dust proofing member 92 and the second dust proofing member 94 are shaped to have a circular cross section, for example. It is preferred that the first dust proofing member 92 and the second dust proofing member 94 are formed of an elastic material. It is preferred to use a rubber being not vulcanized with sulfur or a silicon rubber being low in its low molecular silicon content, as the elastic material. The rubber being not vulcanized with sulfur may use an ethylene propylene rubber, for example.

The first dust proofing member 92 and the second dust proofing member 94 are fitted to the first circuit board 20 and the second circuit board 22, respectively. Referring again to FIG. 6, both the side edges of the first circuit board 20 and both the side edges of the second circuit board 22 are being formed with pairs of notches 96, respectively, each pair spaced apart from each other in the width direction of the housing 16, and which serve as holding portions to hold the first dust proofing member 92 and the second dust proofing member 94, respectively. The distance between the notches 96 of the first circuit board 20 and the distance between the notches 96 of the second circuit board 22 are wider than the distance between the pillars 74.

Referring again to FIG. 4, in the preferred embodiment, the first case 24 is then provided with a groove 98 to receive a first wall 30 side portion of the first dust proofing member 92. The groove 98 is configured as a frame 100 projecting from the first wall 30.

Similarly, referring again to FIG. 5, in the preferred embodiment, the second case 26 is provided with a groove 102 to receive a second wall 32 side portion of the second dust proofing member 94. The groove 102 is configured as a frame 104 projecting from the second wall 32.

Referring again to FIG. 8, in the preferred embodiment, the spacer 70 is also provided with a groove 106 to receive a spacer 70 side portion of the first dust proofing member 92, and a groove 108 to receive a spacer 70 side portion of the second dust proofing member 94.

For the grooves 106 and 108 to be configured, a projection 110 having a T shape cross section integrally projects from the beam 76 of the spacer 70. A horizontal portion 110a of the projection 110, which corresponds to the vertical of the T shape, extends in the length direction of the housing 16, and a vertical portion 110b of the projection 110, which corresponds to the horizontal of the T shape, lies on the opposite side of the horizontal portion 110a to the beam 76. Accordingly, the side surfaces of the grooves 106 and 108 are defined by the beam 76 and the vertical portion 110b, and the bottoms of the grooves 106 and 108 are defined by the horizontal portion 110a.

The distance between the first circuit board 20 and the bottom of the groove 98 of the first case 24 is substantially equal to the distance between the first circuit board 20 and the bottom of the groove 106 of the spacer 70, and the cross sectional diameter of the first dust proofing member 92 is equal to, or slightly larger than these distances.

Also, the distance between the second circuit board 22 and the bottom of the groove 102 of the second case 26 is substantially equal to the distance between the second circuit board 22 and the bottom of the groove 108 of the spacer 70, and the cross sectional diameter of the second dust proofing member 94 is equal to, or slightly larger than these distances.

Further, the length of the first and second dust proofing members 92 and 94 in the width direction of the housing 16 is longer than the distance between the pillars 74 of the spacer 70.

Incidentally, the groove 98 of the first case 24, the groove 102 of the second case 26, and the grooves 106 and 108 of the spacer 70 extend in the width direction of the housing 16, and the positions of these grooves 98, 102, 106, and 108 are the same in the length direction of the housing 16 as the positions of the notches 96 of the first circuit board 20 and the second circuit board 22.

Dust Proofing Structure

Figure 10:
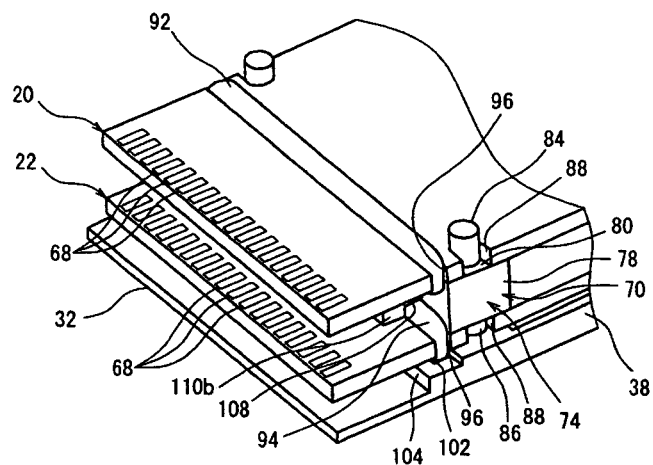
FIG. 10 is a partial schematic perspective view showing an open end of the photoelectric conversion module of FIG. 2, with a first case being detached therefrom.
Figure 11:
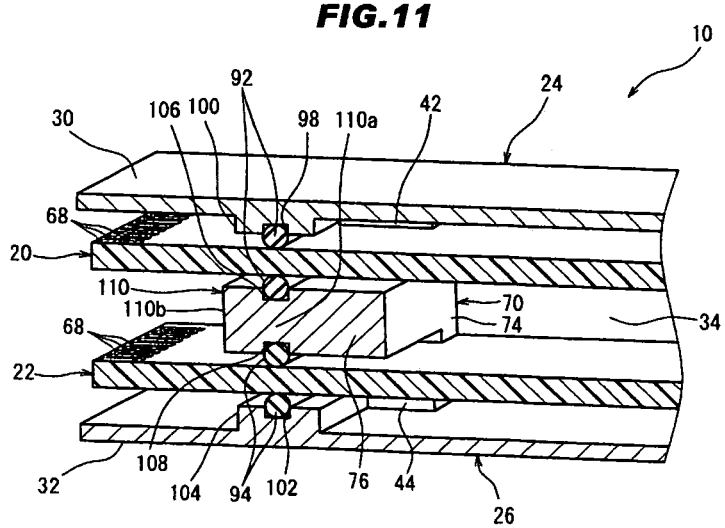
FIG. 11 is a partial schematic perspective view showing the longitudinally halved open end of the photoelectric conversion module of FIG. 2.
Figure 12:
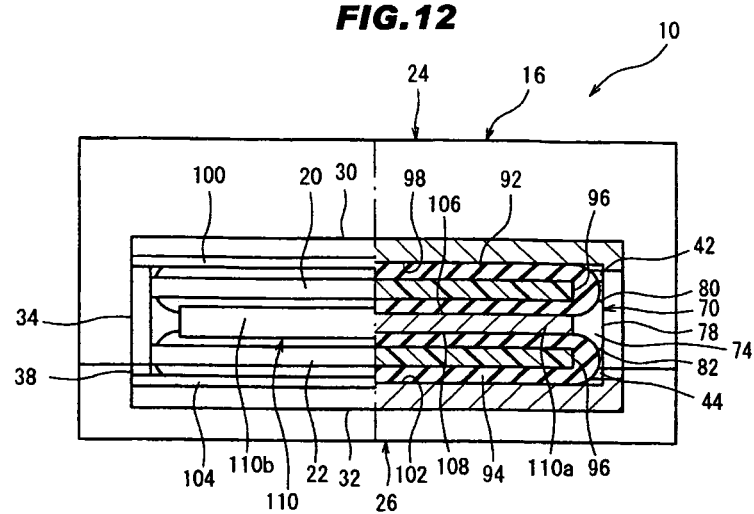
FIG. 12 is a schematic plan view in its left half and a schematic cross sectional view through the first dust proofing member and the second dust proofing member in its right half, showing the photoelectric conversion module of FIG. 2, when viewed from the open end side thereof.

FIG. 10 is a schematic perspective view showing an open end of the photoelectric conversion module 10 with the first case 24 being detached therefrom, FIG. 11 is a schematic perspective view showing the longitudinally halved open end of the photoelectric conversion module 10, and FIG. 12 is a schematic plan view in its left half and a schematic cross sectional view through the first dust proofing member 92 and the second dust proofing member 94 in its right half, showing the photoelectric conversion module 10, when viewed from the open end side thereof.

As shown in FIGS. 10 to 12, the first dust proofing member 92 is fitted to the first circuit board 20 by biting into the notches 96 of the first circuit board 20. The spacer 70 side portion of the first dust proofing member 92 is then received in the groove 106, and the first wall 30 side portion of the first dust proofing member 92 is then received in the groove 98. This arrangement allows the first dust proofing member 92 to adjoin the beam 76 of the spacer 70, thereby filling all of the gap between the first circuit board 20 and the spacer 70, and the gap between the first circuit board 20 and the first wall 30.

Likewise, the second dust proofing member 94 is fitted to the second circuit board 22 by biting into the notches 96 of the second circuit board 22. The spacer 70 side portion of the second dust proofing member 94 is then received in the groove 108, and the second wall 32 side portion of the second dust proofing member 94 is then received in the groove 102. This arrangement allows the second dust proofing member 94 to adjoin the beam 76 of the spacer 70, thereby filling all of the gap between the second circuit board 22 and the spacer 70, and the gap between the second circuit board 22 and the second wall 32.

The above described photoelectric conversion module 10 in one embodiment allows the first dust proofing member 92 to fill the gap between the first wall 30 and the first circuit board 20 and the gap between the spacer 70 and the first circuit board 20, while allowing the second dust proofing member 94 to fill the gap between the second wall 32 and the second circuit board 22 and the gap between the spacer 70 and the second circuit board 22, thereby preventing dust entrance into the housing 16. This allows the photoelectric conversion module 10 to be prevented from degradation in its optical system performance, i.e. degradation in its optical coupling efficiency between the optical cable 14, the lens block 62 and the photoelectric conversion elements 66, due to the dust.

Also, since the first dust proofing member 92 and the second dust proofing member 94 are held by the first holding portion of the first circuit board 20 and the second holding portion of the second circuit board 22 respectively, the assembly of the photoelectric conversion module 10 is facilitated.

The above described photoelectric conversion module 10 in one embodiment allows the first and second dust proofing members 92 and 94 formed of the ring shaped elastic material to be fitted to the first and second circuit boards 20 and 22 respectively, by biting into the pairs of the notches 96 formed at both the side edges of the first circuit board 20 and at both the side edges of the second circuit board 22, respectively. This allows the first and second dust proofing members 92 and 94 to be securely held by the simple configuration.

The above described photoelectric conversion module 10 in one embodiment has the (first and second) grooves 106 and 108 in the spacer 70 to receive the first and second dust proofing members 92 and 94 respectively, therefore allowing the first and second dust proofing members 92 and 94 to be securely held by its simple configuration, when assembled.

Also, the first and second dust proofing members 92 and 94 can, by being received in the first and second grooves 106 and 108 respectively, more securely prevent the dust entrance into the housing 16.

The above described photoelectric conversion module 10 in one embodiment has the (third and fourth) grooves 98 and 102 in the first and second walls 30 and 32 respectively to receive the first and second dust proofing members 92 and 94 respectively, therefore allowing the first and second dust proofing members 92 and 94 to be more securely held by its simple configuration, when assembled.

Also, the first and second dust proofing members 92 and 94 can, by being received in the third and fourth grooves 98 and 102 respectively, more securely prevent the dust entrance into the housing 16.

Also, in the above described photoelectric conversion module 10 in one embodiment, in its preferred embodiment, the first and second dust proofing members 92 and 94 are formed of the rubber being not vulcanized with sulfur or the silicon rubber being low in its low molecular silicon content. This allows the electrode terminals 68 to be prevented from lowering in electrical conductivity due to the adhesion of the sulfur or the low molecular siloxane component desorbed from the first and second dust proofing members 92 and 94. This results in long-term stable operation of the photoelectric conversion module 10.

Incidentally, the silicon rubber being low in its low molecular silicon content results from silicon rubber heating.

Modifications to the Embodiment

The invention is not limited to one embodiment described above, but may embody modifications thereto.

Figure 13:
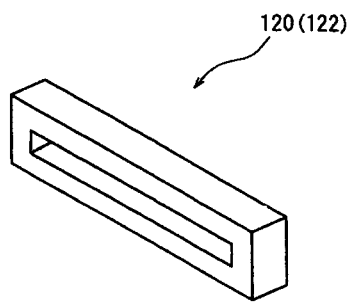
FIG. 13 is a schematic perspective enlarged view showing a first dust proofing member (or a second dust proofing member) in a modification to the embodiment.

For example, there may be used a first dust proofing member 120 and a second dust proofing member 122 as shown in FIG. 13, which are formed of a foaming material. The foaming material has a plurality of pores, and is made of a silicon rubber, for example.

The first and second dust proofing members 120 and 122 are shaped into a square ring, and as with the first and second dust proofing members 92 and 94, are fitted to the first and second circuit boards 20 and 22 respectively.

In this case, the first and second dust proofing members 120 and 122 contain air in the pores. This allows the first and second dust proofing members 120 and 122 to be low in dielectric constant, thereby suppressing the delay of high frequency signals propagating in the first and second dust proofing members 120 and 122. This results in the excellent high frequency signal transmission properties of the photoelectric conversion module 10 using the first and second dust proofing members 120 and 122, while being protected from the dust entrance.

Also, although in the above described photoelectric conversion module 10 in one embodiment, the first and second dust proofing members 92 and 94 have been shaped into the circle in cross section, the first and second dust proofing members 92 and 94 may be shaped into a polygon in cross section, such as a square or the like.

For example, when there are used a first dust proofing member 130 and a second dust proofing member 132 as shown in FIG. 14, which are shaped into a square in cross section, it is preferred that the diagonal direction of the square is the same as the height direction of the housing 16. In this case, in the cross sectional view, the two opposite vertices of the square protrude in the height direction of the housing 16, and the pressure concentrates at the two opposite vertices. This results in the two opposite vertices of the square being compressed in the diagonal direction, and the first and second dust proofing members 130 and 132 tending to be compressed and deformed.

The first and second dust proofing members 130 and 132 can, by tending to be compressed and deformed in this manner, securely fill the gaps between the first wall 30 and the first circuit board 20 and between the spacer 70 and the first circuit board 20, and the gaps between the second wall 32 and the second circuit board 22 and between the spacer 70 and the second circuit board 22, respectively. Consequently, the use of the first and second dust proofing members 130 and 132 allows more securely preventing the dust entrance into the housing 16.

Also, there may be used a first dust proofing member 140 and a second dust proofing member 142 as shown in FIG. 15. The first dust proofing member 140 includes a circular body 140a, and two protrusions (portions to be deformed) 140b integrally protruding in outward and inward radial directions, respectively, from the circular body 140a. Likewise, the second dust proofing member 142 includes a circular body 142a, and two protrusions (portions to be deformed) 142b integrally protruding in outward and inward radial directions, respectively, from the circular body 142a. In this case, the pressure concentrates at the protrusions 140b and 142b, and the protrusions 140b and 142b tend to be compressed and deformed.

The first and second dust proofing members 140 and 142 can, by tending to be compressed and deformed, securely fill the gaps between the first wall 30 and the first circuit board 20 and between the spacer 70 and the first circuit board 20, and the gaps between the second wall 32 and the second circuit board 22 and between the spacer 70 and the second circuit board 22, respectively. Consequently, the use of the first and second dust proofing members 140 and 142 allows more securely preventing the dust entrance into the housing 16.

Further, although in the photoelectric conversion module 10 in one embodiment, the first and second dust proofing members 92 and 94 have been shaped into the elliptic ring in the plan view, there may be used a first dust proofing member 150 and a second dust proofing member 152, one portion of which is cut, as shown in FIG. 16.

That is, the first and second dust proofing members 150 and 152 may be held in some way by the first and second circuit boards 20 and 22 respectively. For example, the first and second dust proofing members 150 and 152 may be held by being wound around the first and second circuit boards 20 and 22 respectively. Accordingly, the first and second dust proofing members 150 and 152 may each be shaped into one string.

Also, although in the above described photoelectric conversion module 10 in one embodiment, the plurality of the optical fibers have been contained in the optical cable 14, the number of the optical fibers may be two or more.

Further, although in the photoelectric conversion module 10 in one embodiment, the housing 16 has been shaped into the step box, the outer shape of the housing 16 is not limited thereto.

Further, although the above described photoelectric conversion module 10 in one embodiment has been provided with the grooves 98, 102, 106, and 108, these grooves 98, 102, 106, and 108 may be omitted, when the gaps can be filled without them.

On the other hand, the photoelectric conversion elements 66 may be disposed in portions other than the first and second circuit boards 20 and 22, but the first and second dust proofing members 92 and 94 have the significant effect of suppressing the optical coupling efficiency degradation, when the photoelectric conversion elements 66 are mounted on the first and second circuit boards 20 and 22, in other words, when the photoelectric conversion elements 66 are mounted thereon adjacent to the spacer 70.

Further, the specific configuration of the lens block 62 is not particularly limited, and the method for fixing the lens block 62 and the MT ferrule 54 is also not limited to the above mention.

Finally, the invention may also naturally be applied to an optical transceiver to/from which the optical cable is attachable/detachable.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A photoelectric conversion module, comprising:
    a housing including a first wall and a second wall parallel to each other, and an open end defined by respective ends of the first wall and the second wall;
    a photoelectric conversion element arranged in the housing;
    an integrated circuit arranged in the housing, the integrated circuit to be electrically connected with the photoelectric conversion element;
    a first circuit board arranged between the first wall and the second wall, the first circuit board being parallel thereto, and including adjacent to the open end an end that is connectable to an external device;
    a second circuit board arranged between the first wall and the second wall, the second circuit board being parallel thereto, and including adjacent to the open end an end that is connectable to the external device;
    electrode terminals provided at the ends of the first circuit board and the second circuit board respectively, the electrode terminals being electrically connected to the integrated circuit;
    a spacer disposed between the first circuit board and the second circuit board, the spacer including two pillars for defining a distance between the first circuit board and the second circuit board, and a beam extending between the pillars;
    a first dust proofing member for sealing a gap between the first wall and the first circuit board and a gap between the spacer and the first circuit board; and
    a second dust proofing member for sealing a gap between the second wall and the second circuit board and a gap between the spacer and the second circuit board,
    wherein the first circuit board further includes a first holding portion for holding the first dust proofing member, while the second circuit board further includes a second holding portion for holding the second dust proofing member.

2. The photoelectric conversion module according to claim 1, wherein
    the first dust proofing member and the second dust proofing member are each formed of a ring shaped elastic material, and
    the first holding portion and the second holding portion comprise a pair of notches formed at both side edges of the first circuit board and a pair of notches formed at both side edges of the second circuit board, respectively.

3. The photoelectric conversion module according to claim 1, wherein
    the spacer includes a first groove to receive a portion of the first dust proofing member, and a second groove to receive a portion of the second dust proofing member.

4. The photoelectric conversion module according to claim 1, wherein
    the first wall includes a third groove to receive a portion of the first dust proofing member, and
    the second wall includes a fourth groove to receive a portion of the second dust proofing member.

5. The photoelectric conversion module according to claim 1, wherein
    the first dust proofing member and the second dust proofing member are each formed of a foaming material.

6. The photoelectric conversion module according to claim 1, wherein
    the first dust proofing member and the second dust proofing member each include a body, and a deformable portion that is more compressed or deformed than the body.

7. The photoelectric conversion module according to claim 1, wherein
    the first dust proofing member and the second dust proofing member are each formed of an ethylene propylene rubber being not vulcanized with sulfur or a silicon rubber containing a reduced low molecular siloxane component.

* * * * *